United States Patent
Chow et al.

(10) Patent No.: US 9,472,498 B2
(45) Date of Patent: Oct. 18, 2016

(54) MULTIPLE ACCESS OVER PROXIMITY COMMUNICATION

(71) Applicant: Oracle International Corporation, Redwood City, CA (US)

(72) Inventors: Alex Chow, Palo Alto, CA (US); R. David Hopkins, II, Foster City, CA (US); Robert J. Drost, Los Altos, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 0 days.

(21) Appl. No.: 14/546,642

(22) Filed: Nov. 18, 2014

(65) Prior Publication Data

US 2015/0069636 A1    Mar. 12, 2015

Related U.S. Application Data

(62) Division of application No. 11/971,492, filed on Jan. 9, 2008, now Pat. No. 8,975,752.

(51) Int. Cl.
*H01L 29/00* (2006.01)
*H01L 23/522* (2006.01)
(Continued)

(52) U.S. Cl.
CPC ........... *H01L 23/5227* (2013.01); *H01L 23/48* (2013.01); *H01L 23/642* (2013.01);
(Continued)

(58) Field of Classification Search
CPC ............. H01L 25/0657; H01L 2924/30107; H01L 25/0652; H01L 23/5227; H01L 23/645; H01L 25/0655; H01L 23/5222; H01L 2924/00; H01L 2225/06531; H01L 2924/19041; H01L 2224/32145; H01L 23/642; H01L 25/18; H01L 24/06; H01L 23/48; H01L 25/50; H01L 25/06

USPC .................................................. 257/531, 777
See application file for complete search history.

(56) References Cited

U.S. PATENT DOCUMENTS 5,786,979 A * 7/1998 Douglass ................ H01L 23/48
                                                              257/777
5,808,587 A * 9/1998 Shima ................ G07C 9/00103
                                                              340/10.34

(Continued)

FOREIGN PATENT DOCUMENTS

WO          0128003 A1    4/2001
WO     2007064785 A2    6/2007
WO     2007064785 A3    6/2007

OTHER PUBLICATIONS

Drost, Robert et al., "Electronic Alignment for Proximity Communication", 2004 IEEE International Solid-State Circuits Conference, 0/7803-8267—Jun. 2004.

*Primary Examiner* — Shouxiang Hu
(74) *Attorney, Agent, or Firm* — Park, Vaughan, Fleming & Dowler LLP

(57) ABSTRACT

A multiple access Proximity Communication system in which electrical elements on an integrated circuit chip provide the multiplexing of multiple signals to a single electrical receiving element on another chip. Multiple pads formed on one chip and receiving separate signals may be capacitively coupled to one large pad on the other chip. Multiple inductive coils on one chip may be magnetically coupled to one large coil on another chip or inductive coils on three or more chips may be used for either transmitting or receiving. The multiplexing may be based on time, frequency, or code.

10 Claims, 12 Drawing Sheets

(51) Int. Cl.
*H04B 5/00* (2006.01)
*H01L 23/48* (2006.01)
*H01L 23/64* (2006.01)
*H01L 23/00* (2006.01)
*H01L 25/065* (2006.01)
*H01L 25/00* (2006.01)
*H01L 25/18* (2006.01)

(52) U.S. Cl.
CPC .............. *H01L23/645* (2013.01); *H01L 24/06* (2013.01); *H01L 25/0657* (2013.01); *H01L 25/18* (2013.01); *H01L 25/50* (2013.01); *H04B 5/0031* (2013.01); *H04B 5/0075* (2013.01); *H04B 5/0081* (2013.01); *H01L 2223/6677* (2013.01); *H01L 2224/0401* (2013.01); *H01L 2224/04042* (2013.01); *H01L 2224/05553* (2013.01); *H01L 2224/16* (2013.01); *H01L 2225/06513* (2013.01); *H01L 2225/06531* (2013.01); *H01L 2924/01005* (2013.01); *H01L 2924/01006* (2013.01); *H01L 2924/01013* (2013.01); *H01L 2924/01023* (2013.01); *H01L 2924/01027* (2013.01); *H01L 2924/01033* (2013.01); *H01L 2924/01043* (2013.01); *H01L 2924/01051* (2013.01); *H01L 2924/01065* (2013.01); *H01L 2924/01066* (2013.01); *H01L 2924/01074* (2013.01); *H01L 2924/01079* (2013.01); *H01L 2924/01082* (2013.01); *H01L 2924/14* (2013.01); *H01L 2924/19015* (2013.01); *H01L 2924/19041* (2013.01); *H01L 2924/19042* (2013.01); *H01L 2924/30105* (2013.01); *H01L 2924/30107* (2013.01); *H04B 5/0012* (2013.01)

(56) References Cited

U.S. PATENT DOCUMENTS

| | | |
|---|---|---|
| 6,101,178 A | 8/2000 | Beal |
| 7,292,050 B1 * | 11/2007 | Chow .................... H01L 23/48 324/681 |
| 2002/0098119 A1 | 7/2002 | Goodman |
| 2004/0018654 A1 | 1/2004 | Drost et al. |
| 2005/0162338 A1 | 7/2005 | Ikeda et al. |
| 2005/0206403 A1 | 9/2005 | Neaves et al. |
| 2006/0017147 A1 | 1/2006 | Drost et al. |
| 2007/0127404 A1 | 6/2007 | Best |
| 2007/0268047 A1 | 11/2007 | Hopkins et al. |
| 2007/0268125 A1 | 11/2007 | Ho et al. |
| 2007/0291535 A1 | 12/2007 | Eberle et al. |

* cited by examiner

MULTIPLE ACCESS OVER PROXIMITY COMMUNICATION

RELATED APPLICATION

This application is a divisional of, and hereby claims priority under 35 U.S.C. §120 to, pending U.S. patent application Ser. No. 11/971,492, entitled "Multiple Access Over Proximity Communication," by inventors Alex Chow, R. David Hopkins, and Robert J. Drost, filed on 9 Jan. 2008, and which is hereby incorporated by reference.

GOVERNMENT LICENSE RIGHTS

This invention was partially made with United States Government support under Contract No. NBCH020055 awarded by the Defense Advanced Research Projects Administration. The United States Government has certain rights in the invention.

BACKGROUND

1. Field of the Invention

The present invention relates to techniques for communicating between integrated circuits. More specifically, the present invention relates to a method and an apparatus for using capacitively coupled communication techniques to communicate between stacked assemblies of laminated integrated circuit (IC) chips.

2. Related Art

Advances in semiconductor technology have made it possible to fabricate a single IC (Integrated Circuit) chip that contains hundreds of millions of transistors. One of the advantages of integrating systems onto a single IC chip is that it increases the operating speed of the overall system. This is because in an alternative design of multiple chips, the signals between system components have to cross chip boundaries, which typically reduces the system's operating speed due to the lengthy chip-to-chip propagation delays and limited number of chip-to-chip wires. In contrast, in a single-chip solution, the signals between system components no longer have to cross chip boundaries, thereby significantly increasing the overall system speed. Moreover, integrating systems onto a single IC chip significantly reduces overall costs because fewer chips are required to perform a given computational task.

However, some systems cannot be integrated into a single chip due to their high complexity and large size. Note that multiple IC chips are typically integrated onto a printed circuit board that contains multiple layers of signal lines for inter-chip communication. Furthermore, signal lines on an IC chip are about 100 times more densely packed than signal lines on a printed circuit board. Consequently, only a tiny fraction of the signal lines on a chip can be routed across the printed circuit board to other chips. For this reason, in such systems, inter-chip communication becomes the bottleneck for increasing the operating speed. Moreover, increases in IC integration densities are expected to exacerbate this bottleneck.

To overcome this inter-chip communication bottleneck, researchers have recently developed an alternate technique, known as "Proximity Communication," for communicating between semiconductor chips. Proximity Communication in an I/O technology that allows two face-to-face chips to communicate without wires. It involves integrating arrays of capacitive transmitters and receivers onto active surfaces of IC chips to facilitate inter-chip communication. If a first chip is situated face-to-face with a second chip so that transmitter regions on the first chip are capacitively coupled with receiver regions on the second chip, it is possible to transmit signals directly from the first chip to the second chip without having to route the signal through intervening signal lines within a printed circuit board.

Although Proximity Communication promises much higher I/O density and lower power, it requires accurate alignment between the two communicating chips. Mechanical misalignment degrades performance by reducing signal and augmenting crosstalk noise; if the chips are sufficiently misaligned, noise may dominate the desired signal, and communication may fail. There are two main types of misalignment: in-plane misalignment and chip separation. Tilt and rotation manifest as aberrations of these two effects.

Several techniques have been developed to mitigate in-plane misalignment in the horizontal (x, y) plane. It can be corrected by adjusting the spatial placement of data on the sending or transmitting (Tx) chip, depending on the relative position of the receiving (Rx) chip. However, the data steering circuitry is complex, costly in power, and works only over a small spatial range—typically two pad pitches. Also, the electronic alignment scheme proposed by Drost et al. in "Electronic Alignment for Proximity Communication," *IEEE International Solid-State Circuits Conference*, 15-19 Feb. 2004, vol. 1, 2004 only works for capacitively-coupled Proximity Communication. No analogous method has yet been developed for inductively coupled communication; in fact, crosstalk noise is a major limitation of such an inductively coupled scheme even in the absence of misalignment, because magnetic fields must have closed return paths, and these loops are often unconfined and large. Recent demonstrations of inductively-coupled data links showed that in the absence of active crosstalk reduction schemes, noise limits the achievable bit-error-rate (BER) to greater than $10^{-4}$ even for a large channel pitch of 60 microns, as described by Miura et al. in "A 1 Tb/s 3W Inductive-coupling Transceiver for Inter-Chip Clock and Data Link," *ISSC Digest Technical Papers*, pp. 142-143, February 2006.

Chip separation also degrades performance by reducing signal level and augmenting crosstalk noise. Unfortunately, it cannot be easily corrected by electronic means. Although in theory it is possible to adapt signaling levels and pad sizes to mitigate the degradation introduced by chip separation, these schemes are overly complex and infeasible to implement in practice. Reliable communication therefore mainly relies on tight tolerances in packaging technologies that can ensure an adequately-small and well-controlled separation between the two communicating chips.

Multiple access schemes are well established in modern wireless telecommunication systems using electromagnetic (radio) waves propagating over large distances. Multiple devices in a cellular network, for example, can communicate simultaneously with a base station over the same space because each device is assigned a different time slot, frequency band, or code. The multiple access schemes used in wireless communication systems are effective at allowing multiple channels to operate across the same space over long distances with minimal interference.

SUMMARY

Some embodiments of the present invention provide a system that enables multiple access over proximity communication in which electrical transmitters and receivers are formed on different chips nearby and in close proximity to one another.

In some embodiments, the electrical transmitters and receivers are conductive pads formed on different chips separated by a dielectric gap to create a capacitor and provide capacitive coupling. In one embodiment, the capacitive multiplexing is performed on one chip and its combined output is capacitively coupled to another chip.

In some of these embodiments, the transmitting pad is larger than the area of multiple receiving pads.

In other embodiments, the electrical transmitters and receivers are inductive coils formed on different chips.

In some of these embodiments, the inductive coils are planar thin-film coils.

In some embodiments, the transmitting coil is larger than an area of multiple receiving coils.

In other embodiments, the receiving coil may be formed on multiple strips arranged in a closed form.

In some embodiments, coils may be formed on three or more chips in general alignment and provide either receiving or transmitting elements for the associated chip. Such an arrangement allows broadcasting to multiple chips.

In some embodiments, the transmitters may be arranged in groups on one chip and multiple sets of receivers may be arranged in corresponding and aligned groups on the other chip.

In some embodiments, the multiplexing is time division multiplexing (TD).

In other embodiments, the multiplexing is frequency division multiplexing (FDM).

In yet other embodiments, the multiplexing is code division multiplexing (CDM).

DETAILED DESCRIPTION

The following description is presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present description. Thus, the present description is not intended to be limited to the embodiments shown, but is to be accorded the widest scope consistent with the principles and features disclosed herein.

Some aspects of the invention utilize multiplexing schemes using various multiple access domains over Proximity Communication. Although the terms "multiplexing" and "multiple access" have somewhat different meanings at the system level in telecommunications, they will be used synonymously herein. Such domains include time, frequency, and code. Because these multiple access domains can be manipulated electrically, the system has much more control over the confinement of a channel within its domain. Communication is therefore much less susceptible to crosstalk noise, and channels can operate over large degrees of in-plane misalignment and chip separation. This obviates the need for complex data steering circuits for electronic alignment correction.

As will be shown, certain multiplexing schemes (such as frequency and code division) recover the signal through correlation. The recovery allows the detection of much smaller signal levels, hence enabling the chips to communicate even when they are very far apart. Conversely, for the same chip separation, much smaller I/O pad sizes can be used thus achieving even higher I/O densities than what Proximity Communication already offers. Furthermore, certain multiplexing methods (such as frequency and code division) reduce the need for a differential reference, enabling a 2× improvement in density over single-ended signaling.

Figure 1:
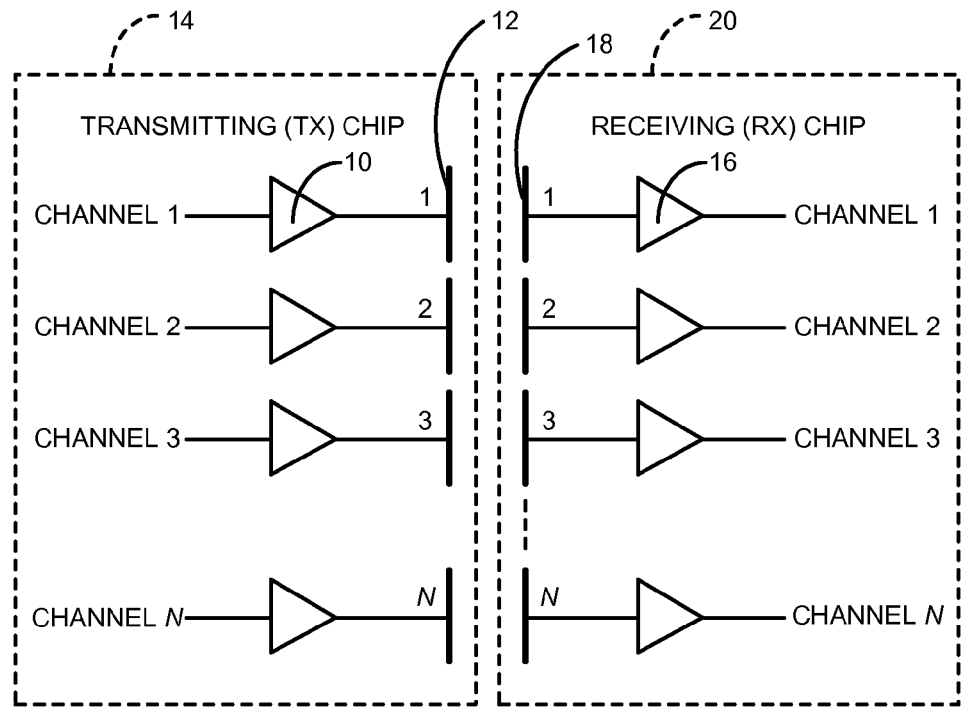
FIG. 1 is an electrical diagram of a convention proximity communication system.

A conventional implementation of a Proximity Communication system is illustrated in the circuit diagram of FIG. 1 in which the channels are divided in space. Each channel consists of a driver 10 sending a signal onto a metal pad 12 on the surface of a transmitting (Tx) chip 14 and a receiver 16 sensing the signal on a metal pad 18 on the facing surface of a receiving (Rx) chip 20. The chips 14, 20 typically each include a semiconductor integrated circuit and are fixed together by a permanent (bonding) or rematable technique. Drost et al. describe such an assembly of laminated chips in U.S. patent application publication 2006/0017147. In the convention system, the sending pad 12 is in close juxtaposition to only one receiving pad 18. The signal on each channel is capacitively coupled from the Tx pad 12 across an intervening gap or other dielectric layer to the corresponding Rx pad 18 of that channel, provided that these two plates are adequately well aligned in space. A system with N channels therefore consists of N drivers 10, N receivers 16, and 2N pads 12, 18, assuming single-ended signaling is used.

Figure 2:
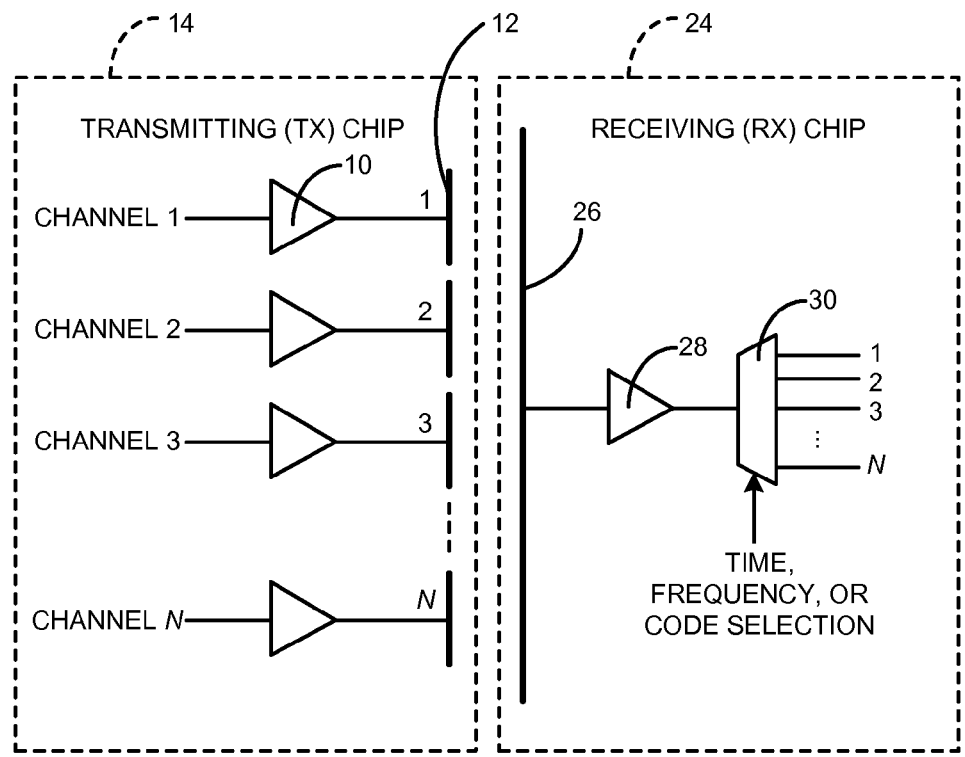
FIG. 2 is an electrical diagram of a capacitively coupled proximity communication system in accordance with an embodiment of the present invention.

An embodiment of the invention implementing multiple access over Proximity Communication is illustrated in the electrical diagram of FIG. 2. Consider a system with N channels that are multiplexed in time, frequency, or code. The transmitting chip 14 may incorporate the conventional transmitting chip 14 of FIG. 1 in which each channel has a separate driver 10 driving an associated metal pad 12. On a receiving chip 24 of this embodiment, however, one large pad 26 is shared across all channels. A receiver 28 senses and amplifies the received signal, which is a combination of signals from all N channels. To recover each channel, a demultiplexer 30 separates the received signal by extracting one channel at a particular time, frequency, or code slot depending on the multiplexing scheme. Here, a system with N channels consists of N drivers 10, N transmitting pads 12, one receiver 28, and one receiving pad 26.

Unlike conventional multiple access schemes, no explicit multiplexer on the Tx chip 14 is necessary. Since all Tx channels couple to the same Rx pad 26, multiplexing is automatic and inherent in the structure of the pads 12, 26.

The inventive embodiment of FIG. 2 several benefits. It is much more immune to mechanical misalignment for several reasons. In the conventional implementation of FIG. 1, each Tx pad 12 must be aligned with the corresponding Rx pad 18 to within a pad pitch (or two pad pitches with micropad data steering, without macro steering) in order to ensure adequate coupling and minimal crosstalk. Using instead the multiplexing scheme of FIG. 2 allows only one receiver pad 26 for all channels. As long as each Tx pad 12 overlaps some portion of the larger receiver pad 26, the signal will be well-coupled from one chip to the other.

Figure 3:
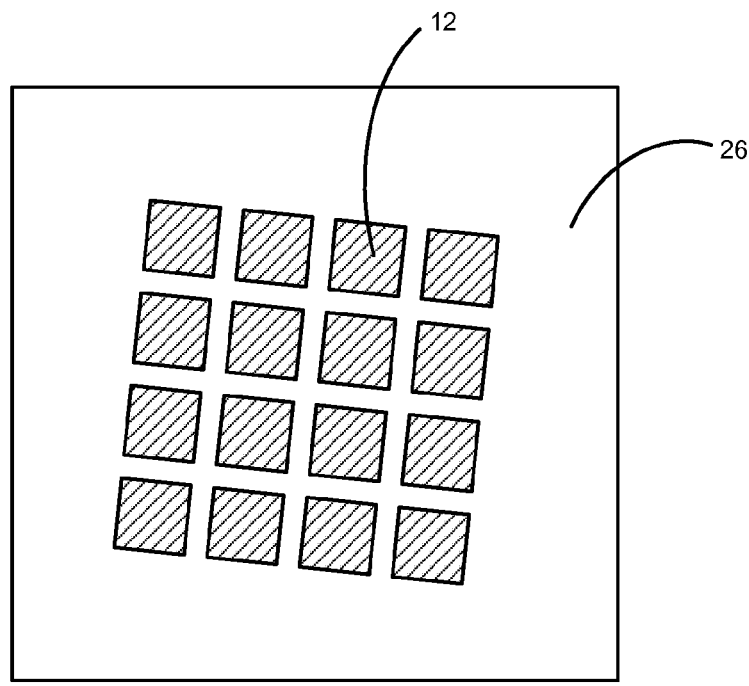
FIG. 3 is a plan diagram schematically illustrating the misalignment accommodated by the proximity communication system of FIG. 2.

An example of the relative sizes of the pads 12, 26 is shown in FIG. 3, which shows that considerable misalignment between the Tx and Rx chips leaves the pads 12, 26 in good capacitive coupling. Further, the chips can be angularly misaligned to some extent.

Another advantage is the improved immunity to crosstalk. Crosstalk noise no longer depends on misalignment because channels are no longer separated in space. Instead, all Tx channels communicate with the same receiver pad 26, and a desired channel can be extracted from the received signal by selecting a particular time slot, frequency band, or code in the demultiplexer. This is especially helpful for mitigating signal degradation at large chip separations. In a traditional implementation of Proximity Communication, not only does the signal degrade very rapidly with increased chip separation, but each channel also sees significantly more crosstalk from adjacent channels. As a result, chips can communicate only over a narrow range of chip separations. Furthermore, unlike in-plane misalignment, chip separation cannot be easily compensated electronically; large chip separations may therefore lead to communication failure. However, multiplexing schemes mitigate this problem, allowing chips to communicate over significantly larger separations than possible otherwise.

The invention also affords improved reliability of critical signal channels. In a system of chips communicating through Proximity Communication, certain critical signals are used for system supervision, monitoring, and control. For example, the alignment or bit-error rate of every chip may be monitored to enable system 'traffic' monitoring, or dynamic swapping of failing routes with redundant routes. Even when a chip suffers gross misalignment, these system signals must be properly communicated. The frequency and code multiplexing schemes presented herein should be used to convey these critical signals because they ensure that the signals can be communicated for virtually any degree of misalignment, given an adequate correlation time. This is because, as we shall note later, correlation through frequency or code allows one to recover a signal even if its level is much lower than the noise floor.

The invention further allows increased immunity to receiver offset. In some multiplexing schemes, such as frequency division multiplexing (FDM) and code division multiplexing (CDM) which will be discussed in detail later, demodulation and filtering are used to recover the signal in each channel. The demodulation and filtering provide intrinsic DC offset compensation so that communication is then mostly immune to receiver offset. This is a major advantage because it greatly reduces the minimum required signal level at the receiver, and therefore extends the maximum allowable chip separation.

The invention also allows improved immunity to other noise sources. Some multiplexing schemes, such as FDM and CDM, employ correlation receivers to recover the signal in each channel. The correlation helps to reject not only crosstalk, but noise from other sources as well. In general, correlation improves the signal-to-noise ratio, and the degree of improvement increases for longer correlation periods. Over very long correlation times, it is possible to reject almost all noise. Because these schemes are also immune to receiver offset, performance is limited only by secondary noise sources such as power supply noise and thermal noise, the levels of which are generally very low. As a result the required signal levels can be significantly reduced, and thus chips can communicate over large chip separations, or using much smaller pads.

The invention further allows adaptive noise rejection. With multiplexing, the signal-to-noise ratio or bit error rate is largely governed by the multiplexing and correlation scheme that is used. Performance can therefore be controlled by electronic design, instead of by mechanical stability which is much more volatile and intractable. Furthermore, noise rejection performance can be adaptively controlled depending on alignment conditions. For example, the correlation time can be lengthened during system operation as signal integrity degrades due to changes in alignment conditions. This allows various time-varying mechanical factors to be adapted, including changes in chip separation.

The invention also provides an alternative approach to electronic correction of misalignment. Since the inventive system is more robust against misalignment, data steering circuitry for electronic alignment correction is no longer necessary. This eliminates the power consumed by such circuitry and reduces complexity in the transmitter design. The need for fewer receivers and receiver pads also reduces complexity and power requirements.

The switching fabric that controls the conventional steering of data in the Tx array is costly in circuitry and power. For a partitioning of one Tx macropad into N×N micropads, the cost in gates and power is approximately proportional to $N^2$. As a result, for a 10×10 array (N=10) in a 180 nm technology, the cost in transmit power is about 60× that required to drive signals without electronic alignment correction and with similar speed performance. One can use a much more coarsely partitioned 4×4 array (N=4) to reduce power, but in this case crosstalk noise can remove up to ⅓ of the signal, and the cost in transmit power is still 11×. Power consumed in the Tx array is typically about 75% of the total power in the Proximity Communication interface. Therefore, eliminating the need for electronic alignment can provide significant power savings.

Figure 4:
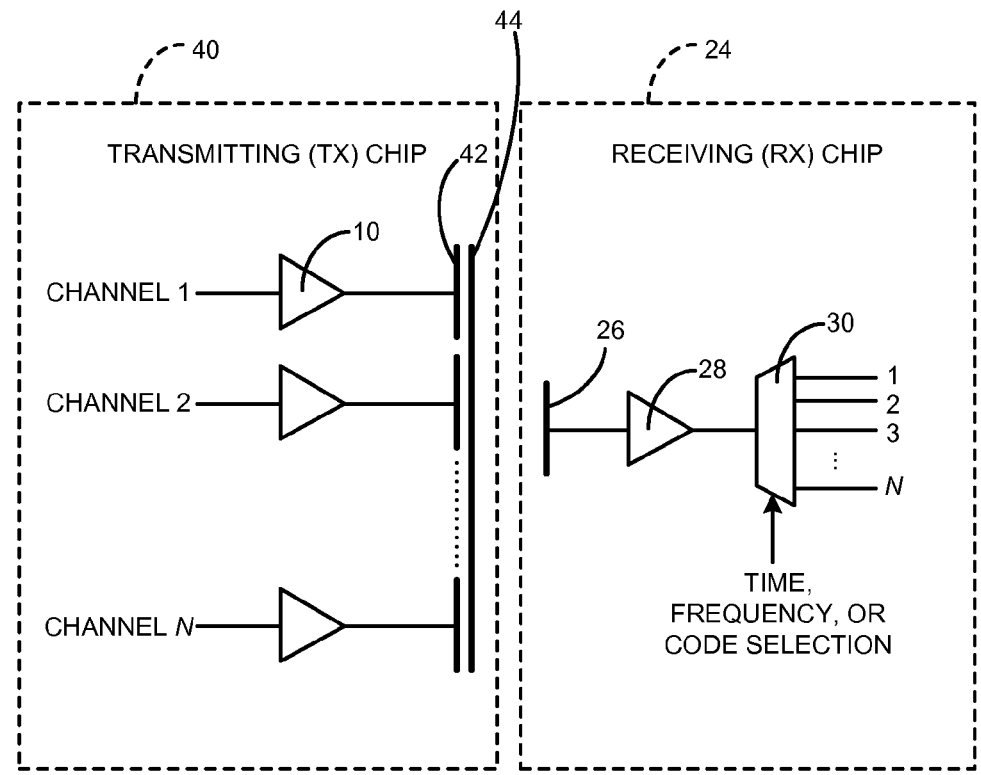
FIG. 4 is an electrical diagram of a capacitively coupled proximity communication system in accordance with an embodiment of the present invention.

Another embodiment of the invention, illustrated in the electrical diagram of FIG. 4, multiplexes signals on a transmitting chip 40 by capacitively coupling all signals through respective electrodes 42 to a single large Tx pad 44. On the Tx chip 40, the on-chip coupling multiplexer can be implemented using metal-insulator-metal (MIM) capacitors for high coupling. The receiving chip 24 again consists of a single Rx pad 26 shared over all channels. The size of the Rx pad 26 may be larger than that illustrated and approximate that of the Tx pad 44. However, a smaller Rx pad 26 beneficially reduces the capacitance of the Rx pad 26, which improves the received signal level.

Figure 5:
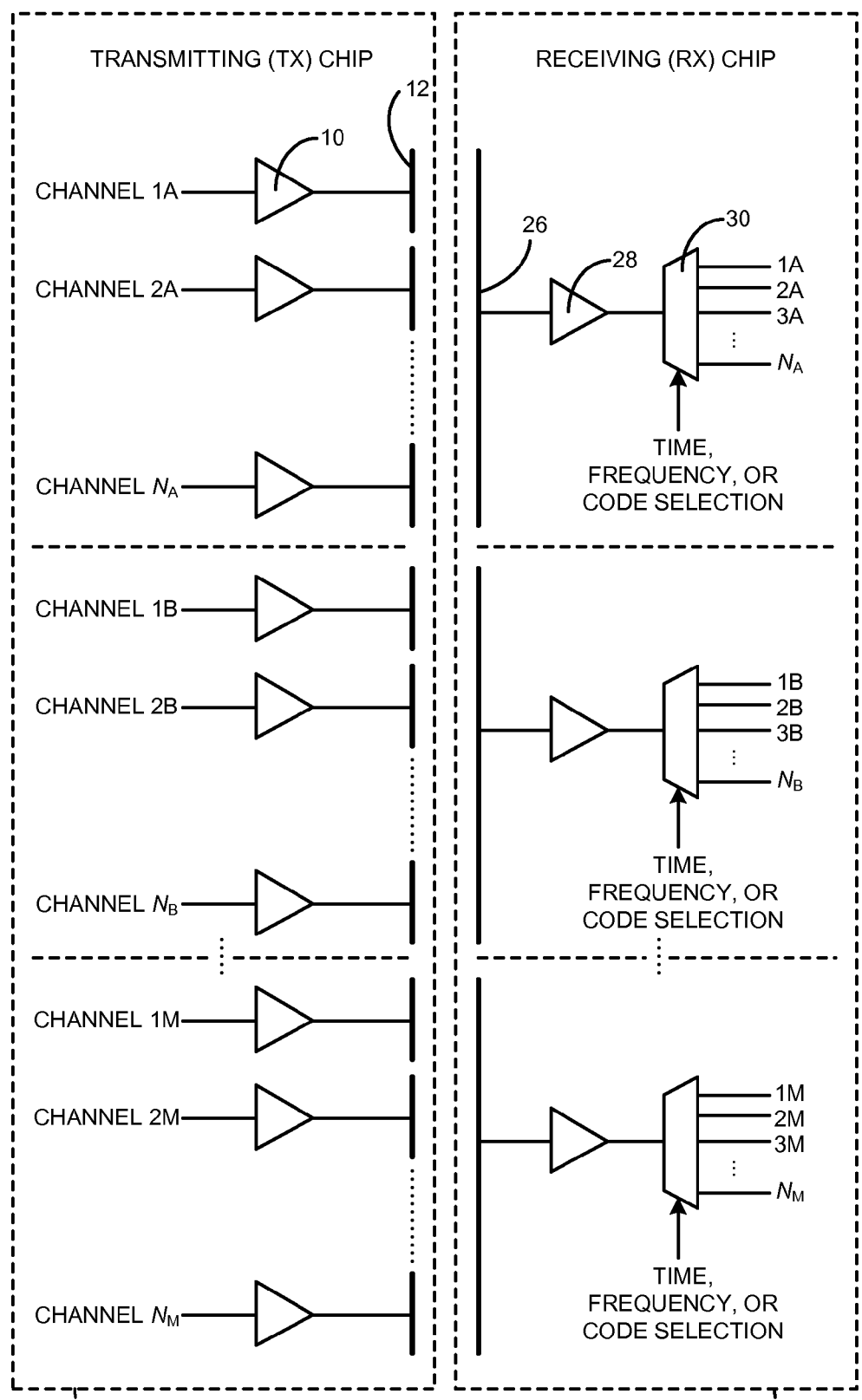
FIG. 5 is an electrical diagram of a proximity communication system incorporating multiple groups of capacitively coupled elements in accordance with an embodiment of the present invention.

Multiplexing over a large number of channels has associated costs, as shall be further discussed below for the different types of multiplexing. Because a Proximity Communication interface may support many thousands of channels, another practical embodiment of the invention, illustrated in the electrical diagram of FIG. 5, includes multiple groups of channels, where only channels within the same group are multiplexed. A transmitting chip 50 includes multiple groups of drivers 10 and Tx pads 12 and a receiving chip 52 includes corresponding multiple groups of receivers 28, demultiplexers 30, and Rx pads 26 capacitively coupled to the Tx pads 12 of the corresponding group on the transmitting chip 50. Note that the number of channels N, in each group may be different.

Proximity Communication may use not only the previously described capacitively coupled communication link but may alternatively be implement on inductively coupled communication links between two or more chips.

Figure 6:
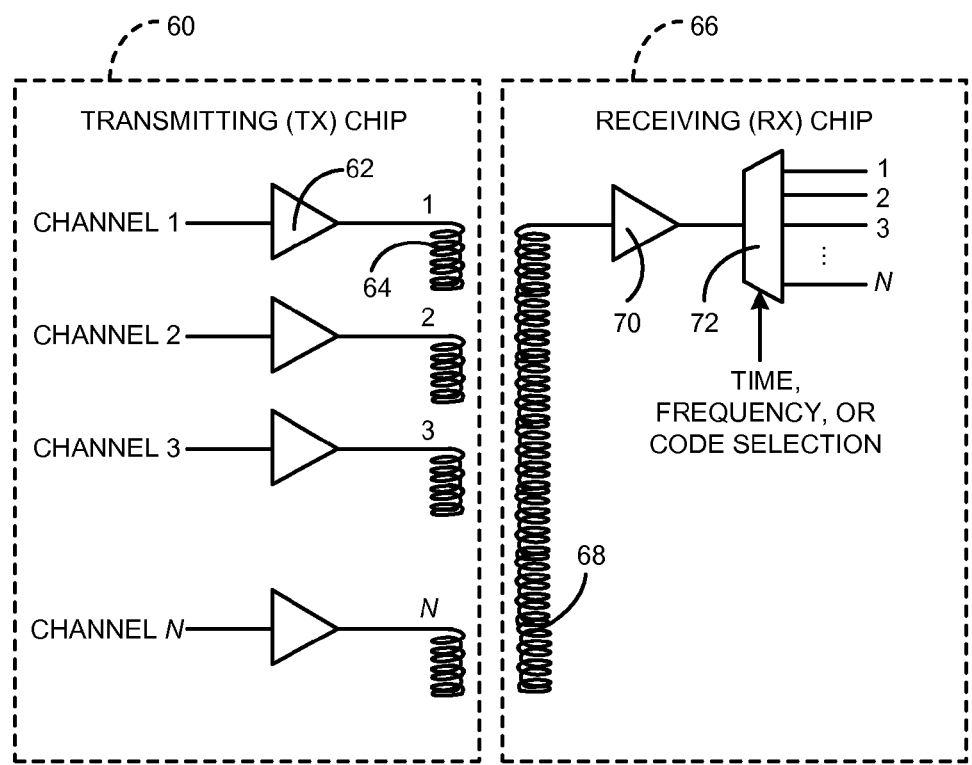
FIG. 6 is an electrical diagram of an inductively coupled proximity communication system in accordance with an embodiment of the present invention.

FIG. 6 shows an embodiment of multiple access over inductive Proximity Communication. It is analogous to the circuit of FIG. 2 showing multiplexing over a capacitive Proximity Communication interface. A system with N channels may be multiplexed in time, frequency, or code. On a transmitting chip 60, each channel has a separate driver 62 driving an inductive coil 64. On a receiving chip 66, however a single inductive coil 68 is shared across all channels. A receiver 70 senses and amplifies the received signal, which is a combination of signals from all channels. All the coils 64, 68 have unillustrated return paths on the ends opposite the driver 62 or receiver 70. To recover each channel, a demultiplexer 72 extracts each channel from the received signal at a respective time, frequency, or code slot. The same multiplexing, demultiplexing, and grouping techniques described for capacitively coupled links can in large part be applied to inductively coupled links.

Figure 7:
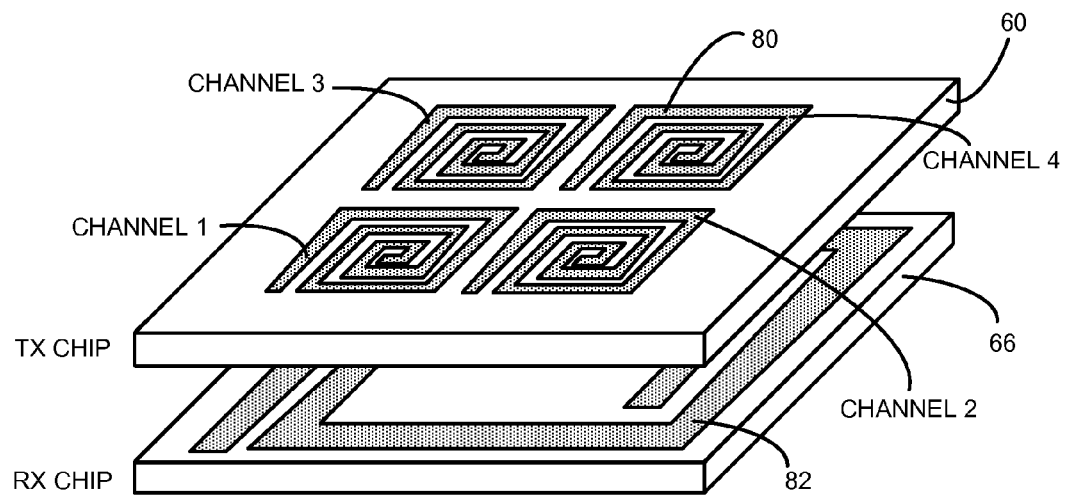
FIG. 7 is an exploded orthographic view of a physical implementation of the inductively coupled system of FIG. 6 in accordance with an embodiment of the present invention.

One physical embodiment of multiplexing four channels over inductively coupled links is illustrated in the exploded orthographic view of FIG. 7. The transmitting chip 60 includes four separate thin-film coils 80 formed on its surface, for example, by photolithography of a metal layer. On the other hand, the receiving chip 66 includes one large thin-film coil 82, the open area of which encloses the area overlapping the collection of transmitting coils 80. Further, the open area of the receiving coil 82 should be large enough to accommodate all the transmitting coils 80 under potential misalignment of the chips. The drivers 62 and the receiver 70 are connected to a respective one end of the coils 80, 82 and returns paths are connected to a respective other end. The chips 60, 66 are fixed together in a stack. Note that the coils 80, 82 are not required to be formed on facing surfaces of the two chips 60, 66 since inductive fields extend relatively far distances.

Figure 8:
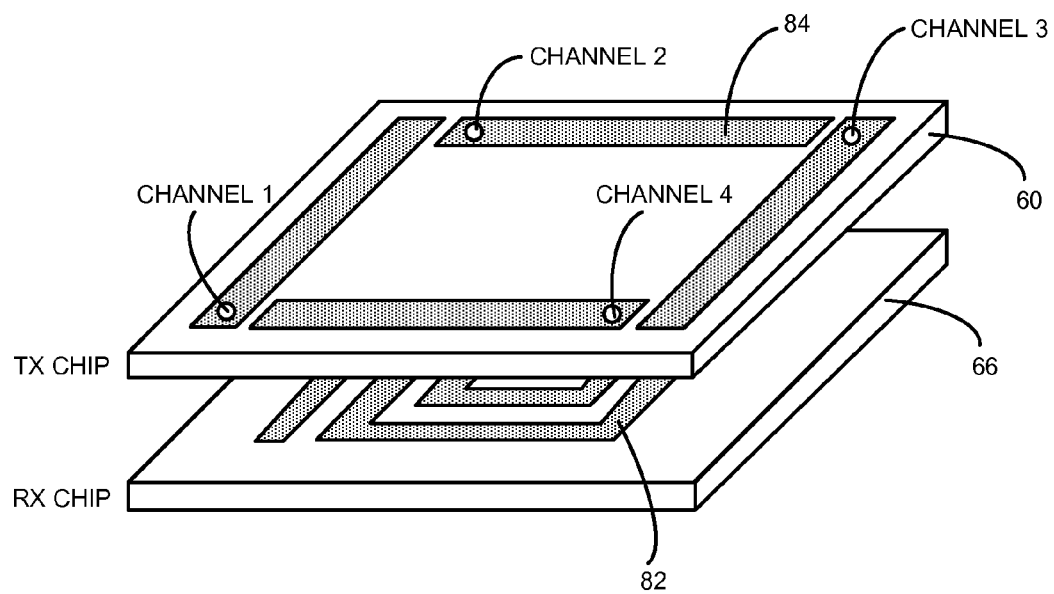
FIG. 8 is an exploded orthographic view of another physical implementation of the inductively coupled system of FIG. 6 in accordance with an embodiment of the present invention.

In another physical embodiment of the inductive multiplexing scheme, illustrated in the exploded orthographic view of FIG. 8, each transmitting channel is driven onto a partial thin-film inductive coil 84 from one end. Such a partial coil 84 may include only a single linear portion, which nonetheless generates an inductive field around it. The collection of all partial coils 84 of all channels forms a loop which overlaps the area of the inductive coil 82 on the receiving chip 66. Of course, the techniques illustrated in both FIGS. 7 and 8 can be extended or reduced to any number of transmitting channels.

Figure 9:
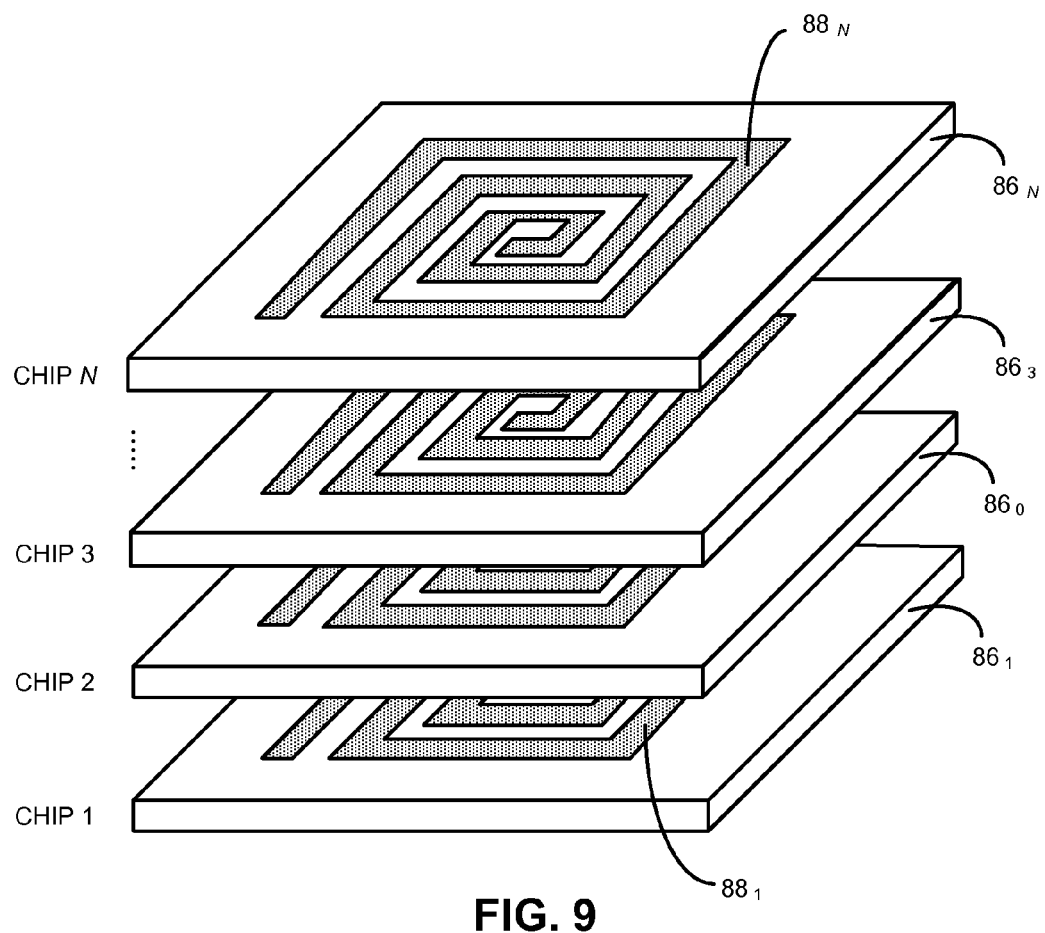
FIG. 9 is an exploded orthographic view of another inductively coupled proximity communication system in accordance with an embodiment of the present invention.

As illustrated in the exploded orthographic view of FIG. 9, because of the widely extending magnetic fields of inductive Proximity Communication, it is possible to communicate through a stack of multiple chips $86_1$-$86_N$. The inductive field emitted by a transmitting coil $88_1$-$88_N$ can be detected by a receiving coil $88_1$-$88_N$ on any other chip in the stack as long as the transmitting and receiving coils have sufficient overlap. Multiplexing schemes prove especially useful in this type of system because they allow multiple chips to simultaneously broadcast signals and messages to multiple other chips in the stack. In this case, each chip may be assigned a specific time, frequency, or code slot; the chip modulates its signals so that the transmitted message occupies only the assigned time, frequency, or code spectrum. A receiving chip in the stack then extracts the message from any particular sending chip by demodulating the received signal. The same coil $88_1$-$88_N$ can be used for both transmitting and receiving.

The above described elements utilize electrical elements, whether capacitor or inductors, to perform the multiplexing rather than the conventional electronic multiplexers or electromagnetic antennas launching a radio wave. In most of the embodiments, the multiplexing is performed as part of the Proximity Communication link between chips.

Figure 10:
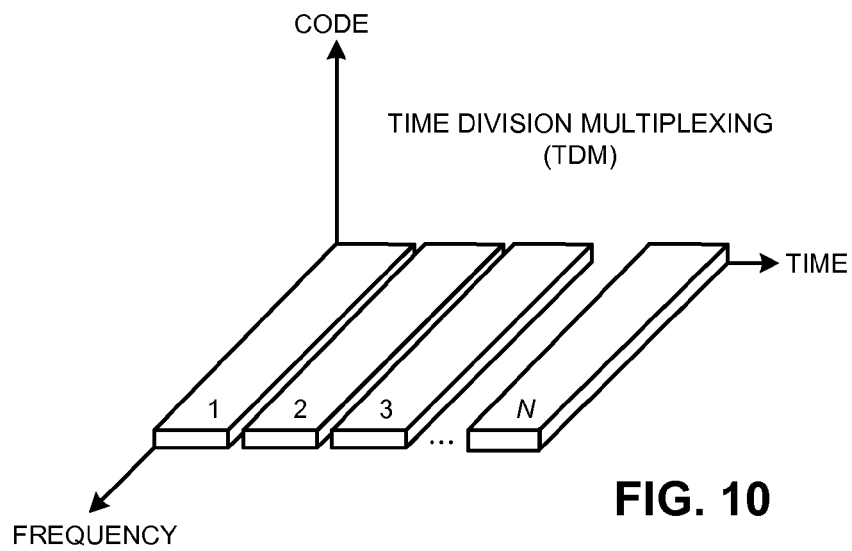
FIG. 10 is a schematic representation of time division multiplexing (TDM).
Figure 11:
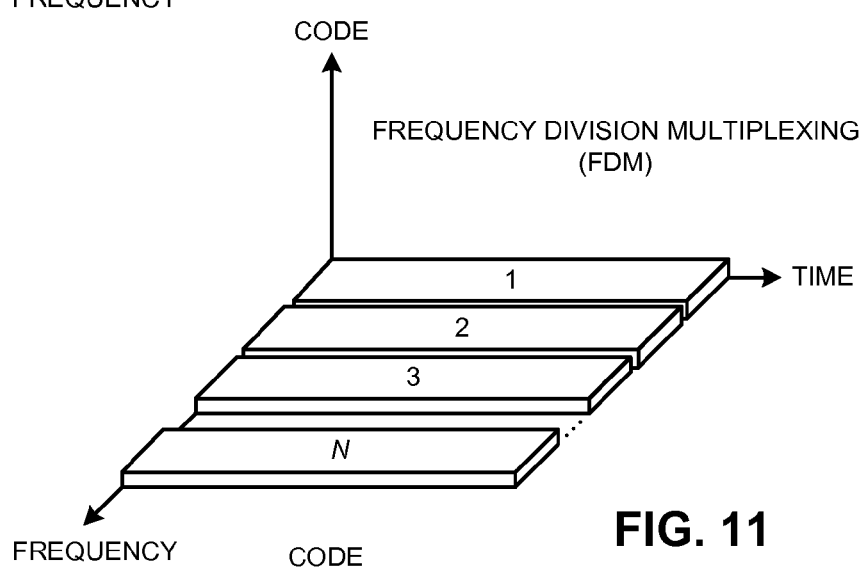
FIG. 11 is a schematic representation of frequency division multiplexing (FDM).
Figure 12:
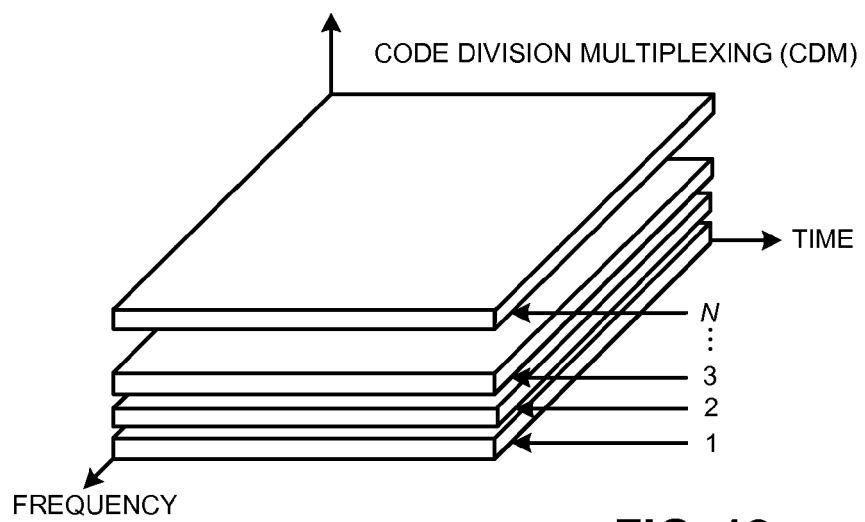
FIG. 12 is a schematic representation of code division multiplexing (CDM).

The most common multiplexing techniques used in communication systems are time-, frequency-, and code-division multiplexing (TDM, FDM, and CDM, respectively). The division of channels in these three domains is illustrated in FIGS. 10-12. In TDM of FIG. 10, each of N channels occupies the entire bandwidth but is assigned one of a number N of serial time slots. The N slots repeat after a given time period. In FDM of FIG. 11, each of N channels is assigned one of a number N of frequencies within the total bandwidth. Each channel has is own assigned sub-bandwidth, which it continues to occupy over a fairly long period. In CDM of FIG. 12, a number N of channels occupy the same entire bandwidth but are assigned different encoding keys. A coded signal encoded according to the encoding keys comprising all the channels is sent over this bandwidth and effectively lasts for a code period. At the receiver, different decoding keys are applied to the same signal to simultaneously extract the multiple coded channels. In the following sections, we discuss implementations of each of these schemes over Proximity Communication and evaluate the benefits and costs of each technique. Although the implementations are discussed in terms of capacitively coupled Proximity Communication, very similar implementations are easily developed for inductively coupled Proximity Communication by substituting inductive coils for capacitive pads.

Time Division Multiplexing

Figure 13:
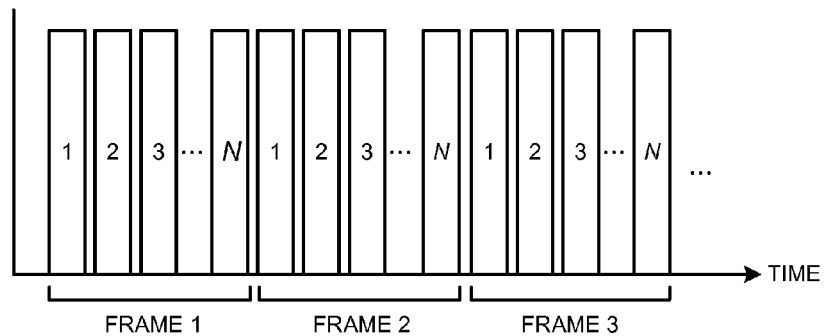
FIG. 13 is a timing diagram illustrating time division multiplexing.

Time-division multiplexing (TDM) is a multiple access scheme where each of N channels occupies a different one of N time slots. The collection of time slots of all channels is known as a frame. The timing chart of FIG. 13 shows the arrangement of time slots and frames for a system with N channels. The time slots are cyclical such that the first channel of each frame follows the last channel of the previous frame.

Figure 14:
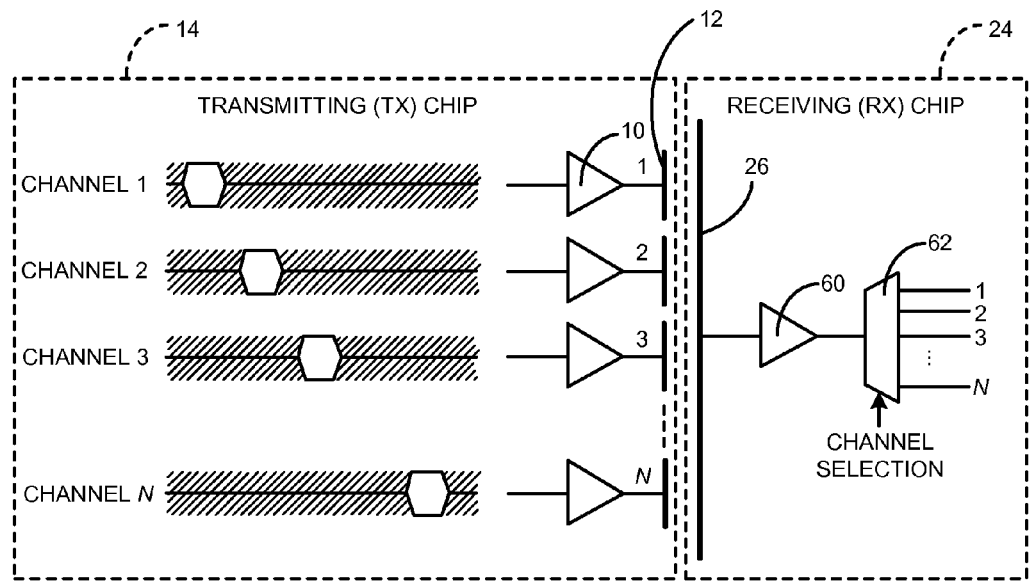
FIG. 14 is an electrical diagram illustrating a capacitively coupled TDM proximity communication system in accordance with an embodiment of the present invention.

The circuit diagram of FIG. 14 illustrates an implementation of TDM over Proximity Communication, where N channels are multiplexed over the same space. On the transmitting chip 14, each of the N channels is active only over a given time slot. At all other times, the channel is nulled. On the transmitting chip 14, the respective driver 10 applies the signal for each channel is driven onto a separate Tx pad 12. On the receiving chip 24, a time-division receiver 60 detects on one Rx pad 26 coupled signals from all N channels. A time-division demultiplexer 62 then separates the signals at different time slots in order to recover each individual channel.

TDM over Proximity Communication enjoys all the benefits of multiplexed Proximity Communication discussed above. Specifically, communication is substantially immune to crosstalk due to misalignment because signals of different channels are separated in time. Electronic alignment correction is no longer necessary, allowing substantial savings in transmit power.

It is difficult to precisely quantify the savings in transmit power because there is a tradeoff between power, signal integrity, and bandwidth. With TDM, crosstalk is negligibly small with an adequate guard band between channels. With electronic alignment correction, however, there is always residual misalignment of up to half a micropad pitch. Therefore, crosstalk decreases for finer Tx pad partitions, but is negligibly small only for prohibitively fine pad partitions.

A detailed study of signal and crosstalk noise for various pad partitions shows that, for a 4×4 partition at a chip separation of 7 μm, the worst-case crosstalk noise is about 27% of the signal, even when using butterfly signaling, which has excellent crosstalk-rejection properties. For a 6×6 partition, crosstalk is about 18% of the signal; and, for a 10×10 partition, 11%. The extra costs in power for electronic alignment correction for these three cases are 11×, 20×, and 60×, respectively, compared to the power required without alignment correction, with similar speed performance. Therefore, even with a conservative comparison against a 6×6 partition, TDM provides a 20× reduction in transmit power, and a 20% improvement in signal.

The most obvious cost of TDM is a reduction in bandwidth. Specifically, the performance of the implementation of FIG. 14 is limited by the speed of the time-division receiver 60 and demultiplexer 62 on the Rx chip 24 because they need to detect transitions from all N channels on a single pad 26. With the worst-case assumption that the TDM receiver 60 can detect transitions no more quickly than a receiver 16 in a traditional proximity communication system, such as in FIG. 1, each TDM channel can operate at only 1/N of the rate of a non-multiplexed channel. The maximum data rate through each channel is correspondingly N times lower.

To alleviate the limit in per-channel bandwidth, multiple receivers may be used in a time-interleaved manner. In this case, the regeneration time for each channel can be separated by using different receivers for different channels. Each receiver (e.g. a sense amplifier) is clocked by a signal with a different phase. Here, the bandwidth is limited by the degree of phase control, which can be well controlled to within a gate delay. This allows a 5 to 10 times improvement in total throughput. Also, the channels can be separated into different groups, as discussed with reference to FIG. 5, each group including, for example, 9 to 16 channels multiplexed within the group. With such grouping and using time-interleaved receivers, there shall be no significant cost in bandwidth.

Implementation of TDM over Proximity Communication presents other subtle requirements. First, receivers need to have higher sensitivity since signal levels are lower due to increased load on the Rx plate 26. Explicit offset compensation is therefore necessary because, unlike FDM or CDM, TDM does not intrinsically provide such offset compensation. Also, at the end of each frame, signals must return to a null state (such that the voltage is at half-swing, for example), so that transitions always occur at the next frame.

Frequency Division Multiplexing

Figure 15:
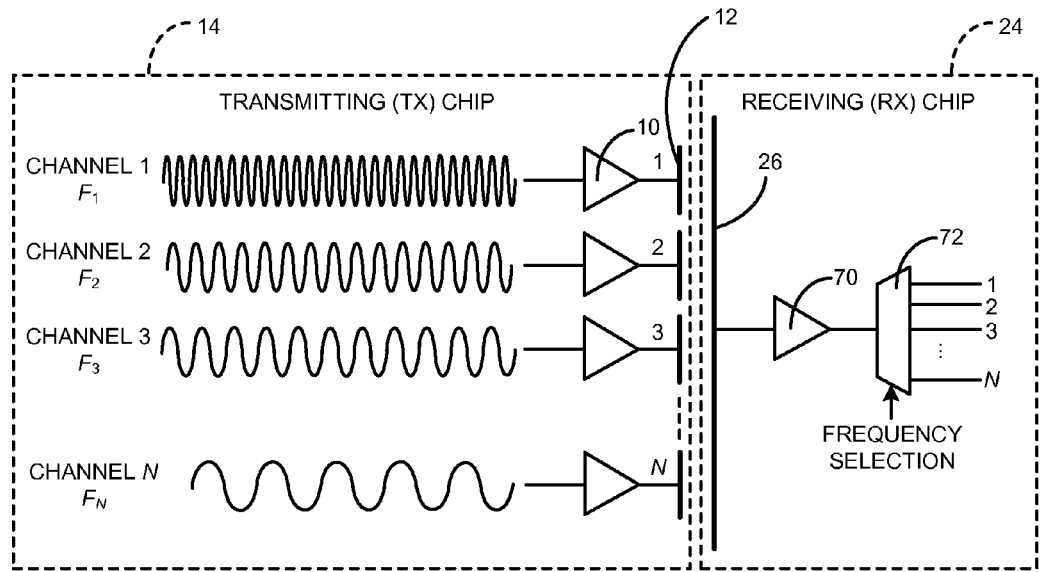
FIG. 15 is an electrical diagram illustrating a capacitively coupled FDM proximity communication system in accordance with an embodiment of the present invention.

In frequency-division multiplexing (FDM), each channel is assigned a unique frequency band. FIG. 15 illustrates this scheme in its simplest, albeit abstract, form, where pure sinusoidal signals are used. Each channel i on the Tx chip 14 is assigned a unique frequency $f_i$, and the signal is driven onto a respective Tx pad 12. All channels operate simultaneously in time.

Figure 16:
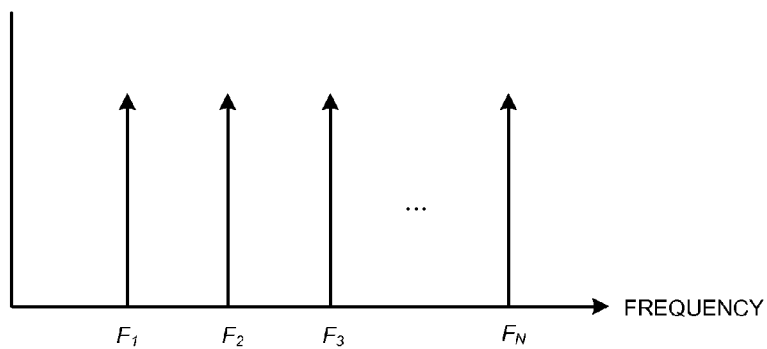
FIG. 16 is a frequency diagram illustrating frequency division multiplexing.

On the Rx chip 24, a single FDM receiver 70 detects the signals from all channels. FIG. 16 shows the amplitude of the frequency spectrum of the received signal. For simplicity, only the positive portion of the spectrum is shown. An FDM demultiplexer 72, in this case a demodulator, separates all frequency components, recovering the signal for each channel into separate output paths. Note that because the spectrum occupancy of each channel is completely disjoint from those of all other channels, each channel can be recovered without any loss or corruption from crosstalk. In more practical implementations with data encoding, however, the spectra of each channel may slightly overlap.

Figure 17:
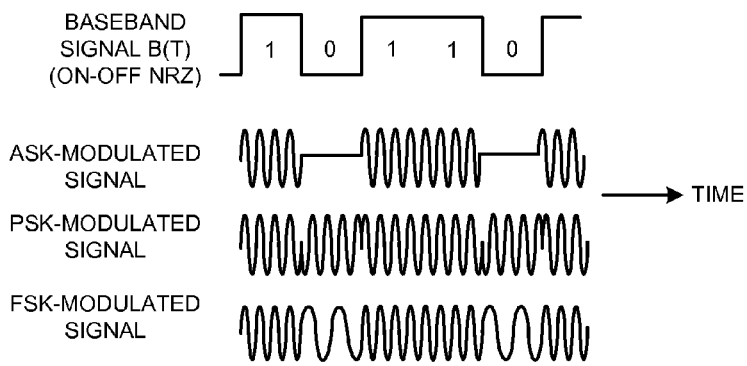
FIG. 17 is a timing diagram illustrating data encoding in different forms of FDM.

In order to communicate data, a means of modulating the carrier wave with the data must be applied on top of the idealized implementation of FIG. 15. Many such schemes exist, the most general of which are amplitude-shift keying (ASK), phase-shift keying (PSK), and frequency-shift keying (FSK). FIG. 17 shows modulation of a unipolar on-off NRZ line-coded baseband signal b(t) using all three schemes.

With amplitude-shift keying (ASK), the two binary data values are encoded as carrier signals with different amplitudes. The simplest form of ASK for binary data communication is on-off keying (OOK), where a value of '1' is represented by the presence of a carrier, and a value of '0' is represented by its absence, or vice versa.

With phase-shift keying (PSK), the two binary data values are encoded as carrier signals with different phases. For binary data communication, the phases of the carriers are typically 180° apart. Note that this is identical to ASK where the baseband signal is line-coded using polar on-off NRZ, such that a '1' is represented by 1 and a '0' is represent by −1, or vice versa, normalized to the signal swing.

With frequency-shift keying (FSK), the two binary data values are encoded as carrier signals with different frequencies. A value of '0' is represented by a carrier of angular frequency $\omega_{c0}$, and a value of '0' is represented by a carrier of angular frequency $\omega_{c1}$. Note that an FSK signal is equivalent to the sum of two ASK signals, one modulated at $\omega_{c0}$ and the other at $\omega_{c1}$, without their DC components.

Figure 18:
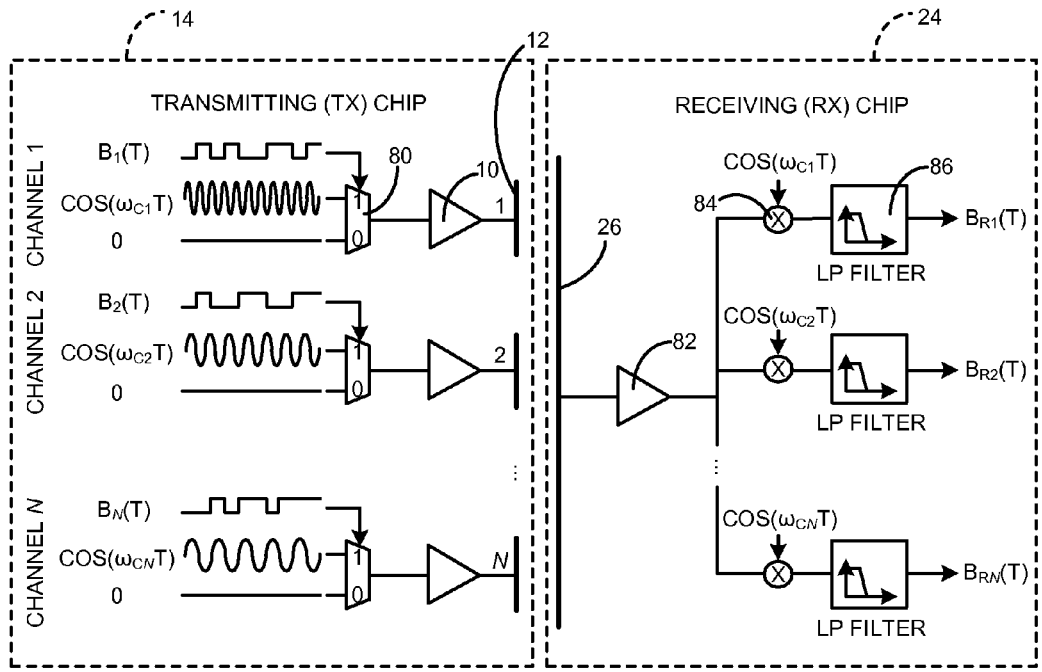
FIG. 18 is an electrical diagram of a capacitively coupled FDM proximity communication system utilizing amplitude-shift keying in accordance with an embodiment of the present invention.

An embodiment of a method of applying FDM over Proximity Communication using ASK is illustrated in the electrical diagram of FIG. 18. Implementations using PSK or FSK are similar in principle. In the ASK embodiment of FIG. 18, N channels are frequency-multiplexed as one group. The baseband signal of each channel i in time is denoted $b_i(t)$.

Each channel is assigned a carrier of angular frequency $\omega_{ci}=2\pi f_{ci}$. The bit value of $b_i(t)$ controls a 2:1 multiplexer 80 and thereby selects between the carrier and some nominal DC value, zero in the illustration. The output of the multiplexer 80 thus becomes an ASK-modulated version of the baseband signal, and is driven onto a Proximity I/O pad 12 on the Tx chip 14.

Let it be assumed that the baseband signals $b_i(t)$ are line-coded using unipolar on-off NRZ and can be treated as stationary random processes. The power spectral density (PSD) $S_{bi}(\omega)$ of channel i is given by $$S_{bi}(\omega) = \frac{T_b}{2}\text{sinc}^2\left(\frac{\omega T_b}{2}\right)\left(1 + \frac{2\pi}{T_b}\delta(\omega)\right)$$

where $T_b$ denotes the bit period. Let the modulation carrier on channel i be $c_i(t)=\cos(\omega_{ci}t)$. The ASK-modulated signal is then $$m_i(t)=b_i(t)\cdot c_i(t)=b_i(t)\cdot\cos(\omega_{ci}t)$$

The PSD of $m_i(t)$, $S_{mi}(\omega)$, is simply $S_{bi}(\omega)$ shifted to $\pm\omega_{ci}$:

$$S_{mi}(\omega)=\tfrac{1}{4}(S_{bi}(\omega-\omega_{ci})+S_{bi}(\omega+\omega_{ci}))$$

Figure 19:
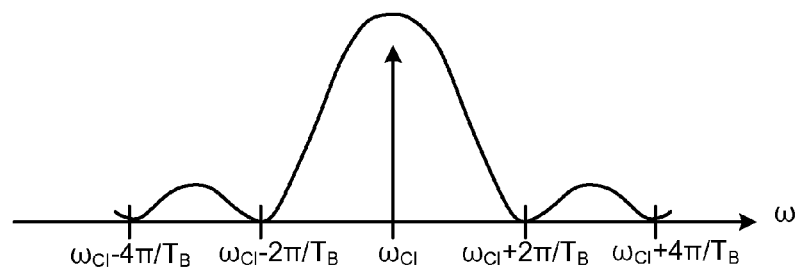
FIG. 19 is a power spectrum of one channel obtainable in the system of FIG. 18.

The positive-frequency half of $S_{mi}(\omega)$ is illustrated in the graph of FIG. 19.

To implement FDM, each channel i is modulated by a carrier with a unique frequency $\omega_{ci}=2\pi f_i$. All channels may be operated simultaneously. To minimize frequency cross talk, the carrier frequency should be chosen such that the separation between adjacent carriers is large compared to the bandwidth of each modulated signal ($\sim 2\pi/T_b$).

Figure 20:
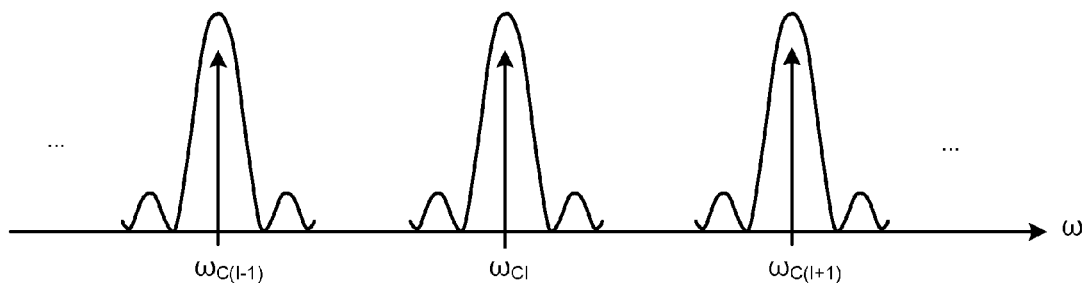
FIG. 20 is a power spectrum of multiple channels obtainable in the system of FIG. 18.

On the receiving chip 24 of FIG. 18, one receiver 82 detects the combined signal all N channels, denoted $m_r(t)$, the PSD of which is shown in the graph of FIG. 20. The received signal experiences the usual attenuation across the Proximity I/O interface and different channels may be attenuated differently. This signal $m_r(t)$ feeds into N separate branches. In each branch i, a mixer 84 demodulates the combined signal $m_r(t)$ by a carrier of angular frequency $\omega_{ci}=2\pi f_{ci}$ corresponding to that of the modulating carrier used on channel i. The part of the spectrum occupied by channel i now appears at baseband. A low-pass filter 86 then rejects parts of the spectrum occupied by all other channels to recover the baseband signal $b_{ri}(t)$.

The very simple implementation of FDM over Proximity Communication illustrated in FIG. 18 may be modified in practice for various encoding and circuit details to improve timing, power, or spectral efficiencies.

ASK is only one of many possible encoding schemes for FDM. Other modulation schemes can be used for various benefits. For example, more complex encoding schemes can provide much higher spectral efficiencies, at the expense of more complex receivers. Examples include Quadrature Phase-Shift Keying (QPSK), Orthogonal QPSK (OQPSK), Minimum-Shift Keying (MSK), and Gaussian MSK (GMSK), all of which are commonly used.

For simplicity of illustration, we have also assumed the pulse shape of the baseband signal to be rectangular. This pulse shape has rather poor spectral efficiency. In practice, pulses may be shaped differently, for example by using Gaussian or raised-cosine filters.

It is also possible to implement the filter as a synchronous rectifier. As long as the controlling signals are coherent with the carriers, the transfer function of the rectifier resembles that of an ideal filter.

Application of FDM over Proximity Communication provides many benefits as discussed above. Because one large Rx pad is used to detect signals from all channels, electronic alignment correction is no longer necessary in the transmitter, reducing power dissipation by 20× compared to using 6×6 Tx steering. Additional power is necessary for modulation, however, as we shall discuss below.

FDM also provides intrinsic offset compensation. Specifically, voltage offset in the receiving amplifier does not propagate beyond the mixer because the mixer eliminates all DC components. Suppose the receiver has an offset which results in a DC shift of $V_o$ at its output. Upon mixing, this offset component becomes $V_o\cdot\cos(\omega_{ci}t)$. Upon passing through the low-pass filter, this component is filtered away, and therefore the offset is effectively eliminated. This offset-rejection property greatly relaxes sensitivity requirements. In a traditional Proximity Communication channel, the received voltage swing on the Rx plate is typically very small; receiver offset subtracts from this signal, therefore limiting the allowable separation between the two communicating chips. With intrinsic offset compensation, the required received signal level is much lower, which permits communication at much larger chip separations, or the use of much smaller I/O pads for higher channel densities.

Communication is mostly immune to crosstalk due to misalignment, because signals of different channels occupy disjoint frequency bands, and can be thus isolated. This is especially helpful when the communicating chips are very far apart. Communication is also immune to other noise sources, because the received signal is recovered through correlation. In general, the SNR improves proportionately with correlation time. The probability of error $P_b$, or bit-error-rate (BER), also improves, and is given by $$P_b = Q(\sqrt{SNR}),$$

Where the Q function is defined as $$Q(x) = \frac{1}{\sqrt{2\pi}}\int_x^\infty e^{-y^2/2}\,dy.$$

Over a long correlation period, almost all noise can be rejected; performance is then dictated only by mixer offset, and therefore only a very small received signal level is needed. This noise-rejection property provides the great benefit of allowing reliable communication even over large chip separations. Alternatively, Proximity I/O pads can be made very small in order to obtain even higher I/O densities.

Noise rejection can also be adaptive; for example, as chips become more separated and signal integrity degrades, the correlation period can be lengthened in order to improve the signal-to-noise ratio (SNR). This provides a simple way to electronically mitigate chip separation during system operation.

FDM requires the generation of many carriers of different frequencies; these frequencies are typically very high in order to support high baseband bandwidths. This imposes an additional cost in power. Fortunately, however, the carriers can be simple periodic sinusoidal signals that can be generated in a very power-efficient manner using resonators with high quality-, or Q-factors. In general, a resonator with a Q-factor of $Q_1$ can generate a carrier at a power cost of only $1/Q_1 \times$. Even in CMOS technology, very high Q-factors are attainable; Q upwards of 50 at 15 GHz have been demonstrated in 90 nm CMOS. Therefore, the generation of high-frequency carriers for FDM should impose only a minor power cost.

The need for encoding and demodulation necessarily introduces additional complexity in the transmitter and receiver circuitry. For example, the receiving chip may need to carry analog RF filters and coherent demodulators. The transmitting chip may need more complex coherent modulators for complex keying schemes; for simple schemes like ASK and PSK, however, the multiplexer implementation of FIG. 18 suffices and can be easily built.

In order to accurately demodulate the multiplexed received signals, the receivers must have highly linear transfer functions over the entire signal range. This requires more elaborate and sophisticated circuit designs.

Because each channel must be modulated at a unique frequency, the number of channels that can be effectively multiplexed is limited by the carrier frequencies that can be generated. To multiplex many channels in one group, it is necessary to use pulse shapes with high spectral efficiencies; this allows less separation between carriers, and hence more channels over the same bandwidth.

Code Division Multiplexing

In code-division multiplexing (CDM), the baseband signal $b_i(t)$ of each channel i is modulated by a spreading code $c_i(t)$. The spreading codes are pseudorandom bit sequences (PRBS), also called pseudo-noise or PN sequences. Although they are periodic and can be deterministically generated, their spectral and correlation properties resemble those of band limited white noise. The spreading code typically has a much higher frequency compared to the baseband signal. A bit in the code is commonly known as a chip, and the code frequency is known as the chip rate.

Figure 21:
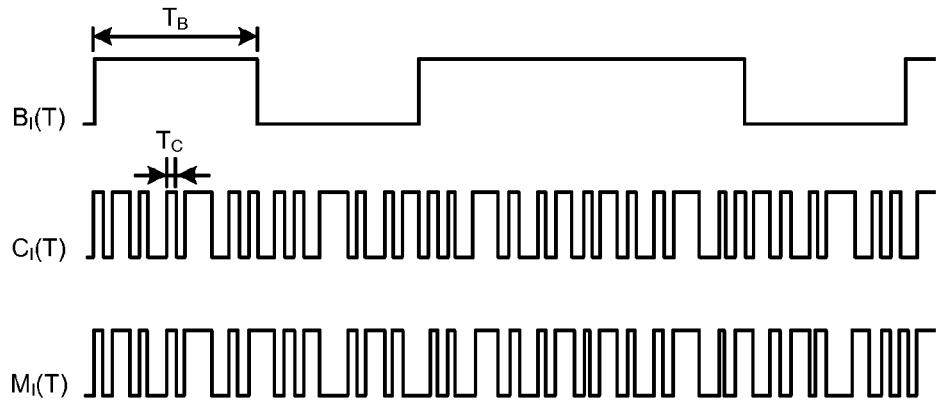
FIG. 21 is a signal timing diagram illustrating CDM encoding of a data signal.

FIG. 21 shows the modulation of a baseband signal $b_i(t)$ by a spreading code $c_i(t)$. The baseband signal has a bit period of $T_b$ and the spreading code has a chip period of $T_c$. For simplicity, assume both $b_i(t)$ and $c_i(t)$ are line-coded using bipolar NRZ or BPSK. The modulated signal is shown as $m_i(t)$.

A signal modulated in this way is unpredictable and behaves like random noise. However, a receiver that possesses the algorithm to generate the spreading code $c_i(t)$ can completely recover the baseband signal simply by correlating $m_i(t)$ with $c_i(t)$. Since $c_i(t)^2=1$, the decoded signal is quite simply $$d_i(t)=m_i(t) \cdot c_i(t)=(b_i(t) \cdot c_i(t)) \cdot c_i(t)=b_i(t).$$

PRBS codes possess the property that the cross-correlation of a code with another code is very low. This means that another receiver v, v≠i, which tries to demodulate $m_i(t)$ using code $c_v(t)$ will obtain a result that resembles noise. This allows us to multiplex many different signals over the same time and frequency spectrum.

Figure 22:
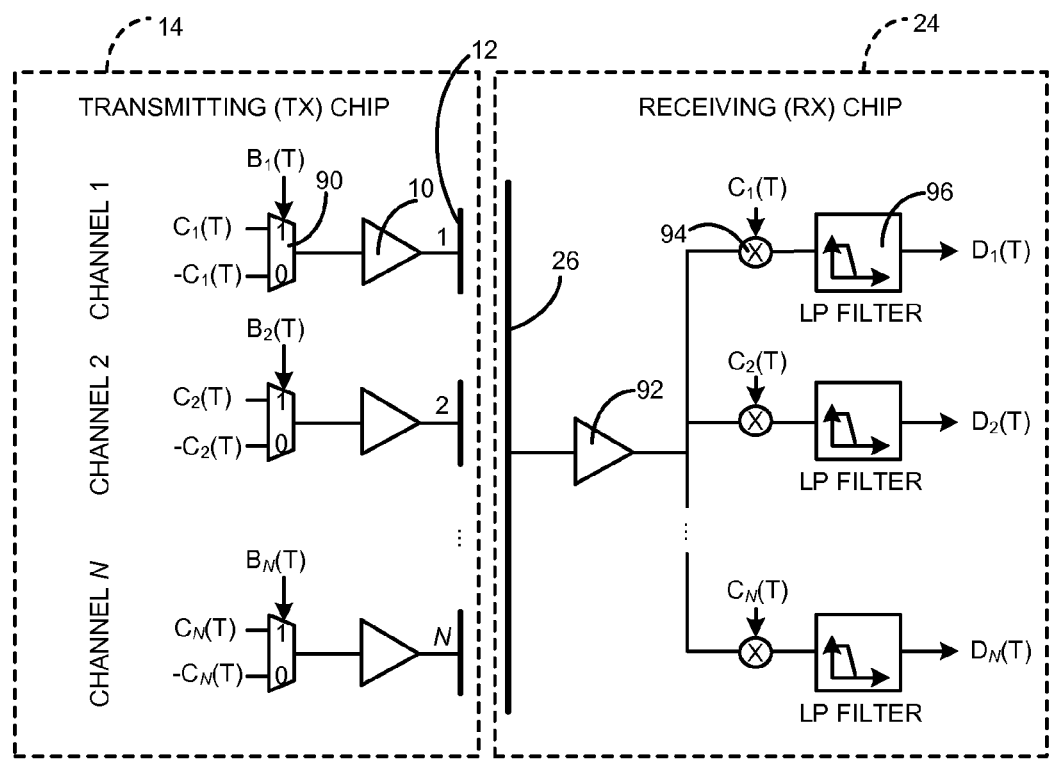
FIG. 22 is an electrical diagram of a capacitively coupled CDM proximity communication system in accordance with an embodiment of the present invention.

FIG. 22 shows an embodiment of a circuit for CDM over Proximity Communication, where N channels are multiplexed as a group. Each channel i is assigned a spreading code $c_i(t)$ which is mostly orthogonal to other codes in the same domain. For simplicity, we assume signals are encoded using BPSK (bipolar NRZ), though the choice of line code does not affect the functionality of the implementation.

On the transmitting chip 14, each baseband signal $b_i(t)$ is modulated in a modulator 90 by its assigned code and is driven onto a Proximity I/O pad 12. Note that the modulator 90 can be either a two-input multiplexer, as shown, or a simple 2-input XNOR gate with $b_i(t)$ and $c_N(t)$ as inputs. Assume the bandwidth of the baseband signal is $B_b$ and that of the spreading code is $B_c$. Since the code has a much higher bit rate than the baseband signal, $B_c \gg B_b$ and the bandwidth of the modulated signal is approximately $B_c$ as well. Modulation by a spreading code effectively increases the bandwidth of the signal by a factor of $B_c/B_b$, which is also known as the coding gain or processing gain, $G_P$. Since $B \sim 1/T$, $$G_P = \frac{B_c}{B_b} = \frac{T_b}{T_c}.$$

As we shall observe later, the processing gain of CDM provides desirable noise-rejection properties. Also, because the codes on each channel are mostly orthogonal, all channels can share the same spectrum and operate simultaneously.

On the receiving chip 24, a single CDM receiver 92 detects the combined signal, $m_r(t)$, from all N multiplexed channels. The received signal experiences the usual attenuation across the Proximity I/O interface, and different channels may attenuate differently. After amplification, the signal $m_r(t)$ feeds into N separate branches. In each branch i, a mixer 94 correlates $m_r(t)$ to a code i corresponding to that used on channel i on the transmitting chip 14. This despreads the signal on channel i; because code i is uncorrelated to other codes, signals from other channels remain spread and continue to appear as noise. A low-pass filter 96 removes much of the noise outside the bandwidth of the baseband signal $b_i(t)$, and it is cleanly recovered.

Application of CDM over Proximity Communication provides all the benefits discussed above. Its main benefit, however, is adaptive noise rejection. First, crosstalk noise is reduced by a factor equal to the processing gain $G_P$, which can be easily adapted by changing the bit rate or chip rate, or both. The SNR also improves proportionately with correlation time. It is therefore possible to dynamically adapt signaling protocols to alignment conditions during system operation.

Using linear receiving amplifiers, CDM provides intrinsic receiver offset compensation, due to the same principle as described above for FDM. Also, because all noise can be rejected over a long correlation period, performance is then dictated only by secondary noise sources such as power supply noise and thermal noise. Since these noise sources are typically much lower than receiver offset, much smaller received signal levels are necessary. This makes possible reliable communication over very large chip separations, or using very small Proximity I/O pads for high density.

CDM also offers the ability to multiplex a very large number of signals. This number is mainly limited by the number of available orthogonal codes. Recent innovations in PRBS generator design have made it simple to generate many different PRBS patterns at high throughput with low circuit complexity. It is possible to extend the code space even further by using Gold or Kasami sequences. Also, because the signals across a Proximity Communication interface are synchronized, it is sufficient to choose codes that are orthogonal at some fixed offset. This greatly enlarges the space of useable codes.

The most obvious costs of CDM are power and per-channel bandwidth. The generation of spreading codes costs power, and since chip rates are high, this power cost can be significant. Reusing a spreading code over multiple groups of multiplexed signals can amortize this cost. Also, CDM makes it unnecessary to use electronic alignment correction; the power savings here can partially offset the coding power cost.

Because the chip rate must be much higher than the data rate in order to achieve a large coding gain, baseband signals cannot run at speeds at technology limits. This lowers the maximum per-channel bandwidth. However, because CDM allows us to use much smaller Proximity I/O pads, it is possible to achieve much higher channel density to obtain similar aggregate bandwidths.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. An inter-substrate communication system, comprising:
   a plurality of substrates arranged in a stack;
   on at least a first one of the substrates, a plurality of inductive transmitting elements, wherein each of the transmitting elements transmits a signal in a corresponding separate channel from a set of channels during a different assigned time slot in a set of time slots, wherein each transmitting element is active in its assigned time slot and is inactive during other slots, and wherein each of the transmitting elements includes a transmitting coil or partial coil; and
   on at least a second of the substrates, an inductive receiving element inductively coupled to the inductive transmitting elements, wherein the inductive receiving element includes a receiving coil in physical opposition to all of the transmitting coils or partial coils, wherein an area of the receiving coil is larger than an area encompassing all of the transmitting coils or partial coils to facilitate signal coupling, and wherein the inductive receiving element is coupled to a de-multiplexer on the second substrate.

2. The inter-substrate communication system of claim 1, wherein the inductive transmitting elements include a plurality of first inductive loops.

3. The inter-substrate communication system of claim 2, wherein the inductive receiving element includes a second inductive loop in opposition to all of the first inductive loops.

4. The inter-substrate communication system of claim 1, wherein the inductive transmitting elements includes a plurality of separately driven conductors arranged in a transmitting loop.

5. The inter-substrate communication system of claim 4, wherein the inductive receiving element includes an inductive loop in opposition to the transmitting loop.

6. The inter-substrate communication system of claim 1, wherein the first one of the substrates includes a plurality lines conveying multiplexed data signals multiplexed to the respective transmitting elements.

7. The system of claim 6, wherein the multiplexed data signals are time multiplexed.

8. An inter-chip communication system, comprising:
   a plurality of chips arranged in a stack; and
   respective inductive elements formed on each of the plurality of chips and aligned therebetween;
   wherein the respective inductive elements includes a plurality of inductive transmitting elements, wherein each of the transmitting elements transmits a signal in a corresponding separate channel from a set of channels during a different assigned time slot in a set of time slots, wherein each transmitting element is active in its assigned time slot and is inactive during other slots, and wherein each of the electrical transmitting elements includes a transmitting pads coil or partial coil; and
   wherein the respective inductive elements includes an inductive receiving element inductively coupled to the inductive transmitting elements, wherein the inductive receiving element includes a receiving coil formed at one of the plurality of chips and in physical opposition to all of the transmitting coils or partial coils at the rest of the plurality of chips, wherein an area of the receiving coil is larger than an area encompassing all of the transmitting coils or partial coils at one of the rest of the plurality of chips to facilitate inductive coupling, and wherein the inductive receiving element is coupled to a de-multiplexer.

9. The system of claim 8, wherein the inductive elements include inductive loops.

10. The system of claim 8, further comprising:
    an electrical driver applying a signal to at least one of the inductive transmitting elements; and
    a receiver receiving the signal from the inductive receiving element.

* * * * *